United States Patent [19]

Bratschun

[11] 4,132,341
[45] Jan. 2, 1979

[54] HYBRID CIRCUIT CONNECTOR ASSEMBLY

[75] Inventor: William R. Bratschun, LaGrange, Ill.

[73] Assignee: Zenith Radio Corporation, Glenview, Ill.

[21] Appl. No.: 764,305

[22] Filed: Jan. 31, 1977

[51] Int. Cl.² .............................................. B23K 1/12
[52] U.S. Cl. .............................. 228/122; 228/180 A; 228/224; 228/248; 228/254; 228/263
[58] Field of Search ........... 228/122, 160, 179, 180 R, 228/180 A, 4.5, 207, 224, 248, 254, 263; 339/275 B, 275 R, 275 T; 29/473.1

[56] References Cited

U.S. PATENT DOCUMENTS

| | | | |
|---|---|---|---|
| 3,060,402 | 10/1962 | Olsson | 339/275 B X |
| 3,381,081 | 4/1968 | Schallioc | 339/275 B X |
| 3,770,874 | 11/1973 | Krieger | 339/275 B X |
| 3,844,026 | 10/1974 | Hutchins | 228/263 X |
| 3,972,463 | 8/1976 | Conlon | 228/179 X |
| 4,004,726 | 1/1977 | Ellington | 228/179 X |

Primary Examiner—Donald G. Kelly
Attorney, Agent, or Firm—Nicholas A. Camasto

[57] ABSTRACT

A method of forming a connector assembly in association with a hybrid circuit by soldering a plurality of relatively rigid connectors thereto, the resulting assembly being capable of self-supporting the hybrid circuit without the use of ancillary mechanical supporting devices when plugged into a suitably configured printed circuit board or the like. According to the method, a predetermined amount of solder paste is deposited on each of the hybrid circuit substrate terminal pads and one end of each of the rigid connectors is positioned on a respective one of the thusly formed solder paste fillets. Heat is then applied to the substrate reflowing the solder paste fillets and thereby enveloping the terminal pads and their associated connectors for achieving a high strength non-mechanically supported solder connection between each of the connectors and its associated terminal pad. In one embodiment of the invention, two such hybrid circuit-connector assemblies are formed simultaneously.

9 Claims, 7 Drawing Figures

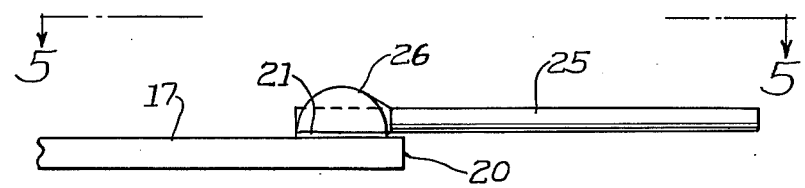
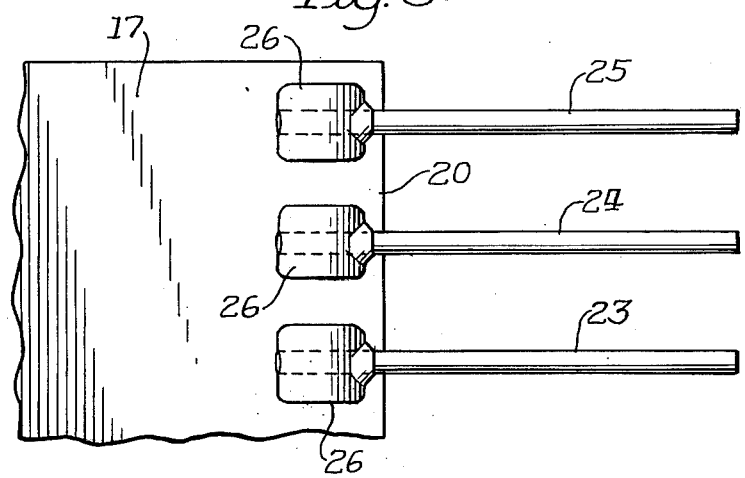
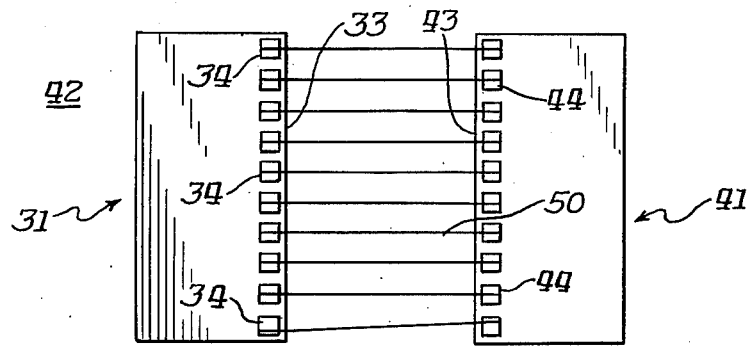
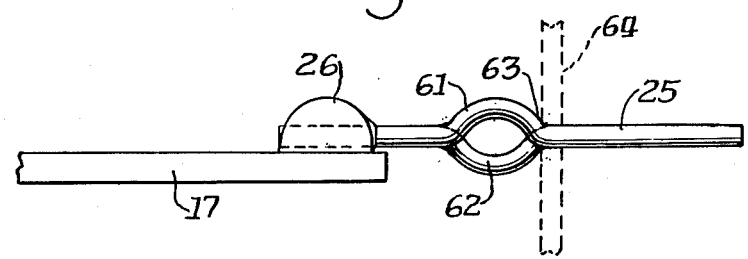

HYBRID CIRCUIT CONNECTOR ASSEMBLY

BACKGROUND OF THE INVENTION

This invention relates to hybrid circuits and more particularly to a method of forming an improved connector assembly for use with thick film electrical circuits.

Beginning with the invention of the point-contact transistor in the late 1940's and spurred by the development of the first integrated circuits in the late 1950's, there has been a continuous trend in the electronics industry toward miniaturization of electronic assemblies. Totally integrated monolithic circuits now enable the fabrication, for example, of an entire computer on a single slice of silicon. Although found in widespread use, monolithic circuits impose various design constraints which must be observed. Among other factors, they are extremely expensive to fabricate in small quantities, they do not perform well as high frequencies, e.g. in the microwave region, and they are essentially low power devices.

The hybrid integrated circuit overcomes some of the foregoing design constraints while maintaining the objective of circuit miniaturization. Hybrid integrated circuits are normally classified into two basic types—the thick film hybrid circuit and the thin film hybrid circuit. In thick film circuit fabrication, screen printing techniques are conventionally used to deposit selected geometries of conductive, resistive, and capacitive pastes on a ceramic substrate. The deposited patterns are subsequently fired at a high temperature, generally between 700° and 1000° C, to form a hard film approximately 1 mil thick. Discrete capacitors and active circuit elements such as transistors may also be included on the substrate of the circuit. On the other hand, thin film circuits are normally formed by vaporizing thin film materials in a high vacuum which are deposited as a thin coating onto a glass or a ceramic substrate, usually in thicknesses of 0.10 mils or less. Patterns are then selectively etched into the conductive and resistive coatings to form resistors with connecting conductive paths.

In the case of both thick and thin film hybrid circuits, it is typically necessary to provide means for connecting and/or disconnecting the circuit from the remainder of the electrical system with which it is intended to operate. For this purpose, a series of conductive terminal pads, often formed at the same time and continuously with the conductive film on the substrate, are typically disposed along one edge of the substrate to provide access to the circuit. A series of relatively rigid elongated conductive connectors are then connected, in both a mechanical and electrical sense, to the terminal pads for providing a facility whereby the circuit may be conveniently plugged into or out of, for example, a suitably configured printed circuit board or, alternatively, an appropriate interfacing socket.

It has been generally accepted by prior art workers in this field that merely soldering a connector to the terminal pad will not produce a connection exhibiting sufficient mechanical strength to result in a commercially acceptable product. In particular, it has been found that connectors merely secured to the substrate terminal pads by solder connections tend to peel from their solder fillets much too easily when handled even in a careful manner. Accordingly, where soldering techniques are used to join a connector to a substrate terminal pad, it is conventional practice to protect the connection by encapsulating the entire circuit in an organic plastic package or by utilizing one of various other well known mechanical aids in an attempt to strengthen the connection. For example, connectors having clips at one end adapted to engage the substrate and mechanically strengthen the connection between a connector and its associated terminal pad are well known in the art. Other prior art approaches using ancillary mechanical aids to strengthen the connector-terminal pad connection include that of providing a flanged connector insertable through a suitable aperture formed in the terminal pad. The connector and terminal pad aperture are configured for creating an effect whereby the connector flange cooperates with the substrate to mechanically strengthen the connection. While only two mechanical strengthening aids have been specifically described above, it will be appreciated that a variety of other similar techniques are in common use.

Particularly on a mass or volume production basis, the costs associated with the provision and installation of the foregoing interfacing connectors forms a significant portion of the entire cost of producing a completed hybrid circuit. In thick film circuits, for example, the connectors themselves contribute the highest material costs associated with the entire assembly. Moreover, to a large extent the high material costs associated with the connectors result from the inclusion of the heretofore considered necessary ancillary connection strengthening aids discussed above. These aids have been referred to herein as being ancillary since, for purposes of achieving a good electrical connection, a solder connection is nevertheless generally formed between the connector and the terminal pad. In order to minimize these costs, and thereby the cost of the completed hybrid assembly, the present invention provides a method for firmly securing a plurality of relatively rigid conductive connectors to the terminal pads of a hybrid circuit substrate without the use of ancillary connection strenghtening devices.

SUMMARY OF THE INVENTION

In accordance with the foregoing it is an object of the present invention to provide a novel method for forming a connector assembly for use with hybrid circuits and particularly thick film hybrid circuits.

It is another object of the present invention to provide a method for forming a connector assembly in association with a thick film hybrid circuit which is capable of self-supporting the circuit without the use of ancillary mechanically supporting means.

These and other objects of the invention are accomplished by initially depositing a predetermined amount of high strength solder paste on each of the terminal pads disposed on the substrate of a thick film circuit. One end of each of a plurality of relatively rigid connectors is then positioned on a respective one of the solder paste fillets whereupon heat is applied to the substrate for reflowing the solder paste fillets. In order to achieve a high strength solder connection between each of the rigid connectors and its associated terminal pad, each solder paste fillet includes a sufficient amount of solder such that, after reflowing, each terminal pad along with its associated rigid connector is substantially enveloped in solder. That is, each hardened solder fillet substantially entirely overlies its associated terminal pad and extends vertically above the circuit substrate a distance at least corresponding to the vertical dimension of the installed connectors.

In another embodiment of the invention a second thick film circuit is provided and oriented in a common horizontal plane with the original circuit. The terminal pad bearing edges of the two circuits are opposingly disposed in parallel spaced relationship with each of the terminal pads of the original thick film circuit being disposed in transverse alignment with one of the terminal pads of the second circuit. After accomplishing a solder paste deposition step as described above, each of the rigid connectors is bridged across a pair of transversely aligned terminal pads. Heat is subsequently applied simultaneously to both circuit substrates to reflow the solder paste fillets whereupon a high strength solder connection is achieved between both ends of each of the connectors and their associated terminal pads located on the original and second thick film substrates. Due to the tendency of the rigid connectors to settle centrally of and at the bottom of each solder fillet, a self-aligning action is achieved wherein the connectors self-align transversely of the edges of the thick film substrate. Thusly, upon centrally cutting the wire connectors two thick film circuit-connector assemblies are simultaneously realized.

BRIEF DESCRIPTION OF THE DRAWINGS

FIG. 4 is an enlarged fragmentary side elevational view illustrating a thick film circuit-connector assembly constructed in accordance with the method of the present invention.

FIG. 5 is an enlarged fragmentary top plan view taken along the line 5—5 of FIG. 4.

FIG. 6 is a diagrammatic top plan view illustrating another embodiment of the method of the present invention.

FIG. 7 is an enlarged fragmentary side elevational view similar to FIG. 4 illustrating a method of modifying the connector assembly conductors for mating with a printed circuit board, with a printed circuit board substrate shown in phantom.

DESCRIPTION OF THE PREFERRED EMBODIMENT

Figure 1:
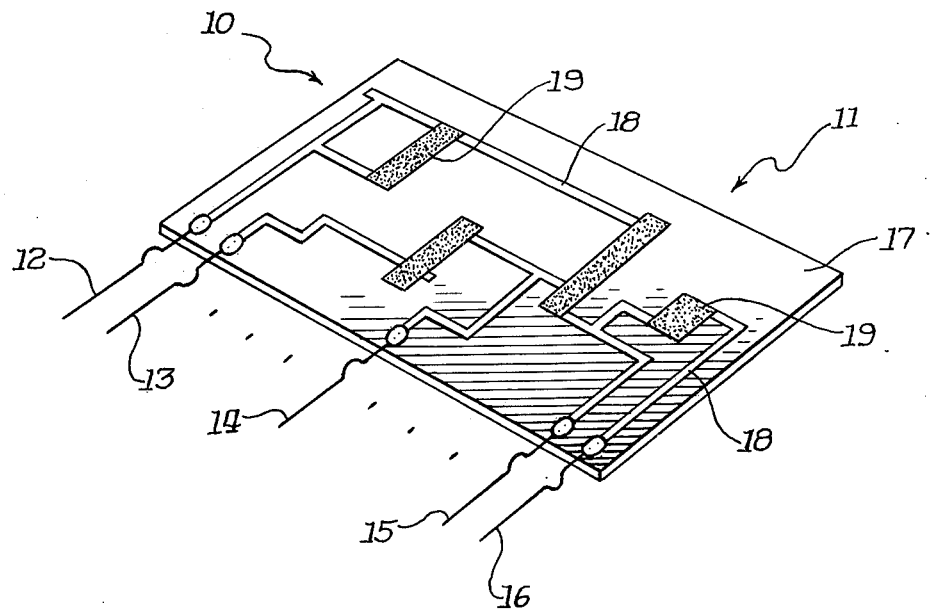
FIG. 1 is a perspective view of a thick film circuit-connector assembly constructed in accordance with the method of the present invention.

Referring now in greater detail to the various figures of the drawings wherein similar reference numerals refer to similar parts, a thick film circuit-connector assembly constructed in accordance with the process of the present invention is generally shown at 10 in FIG. 1. Device 10 basically comprises a thick film hybrid circuit 11 and a plurality of relatively rigid conductive connectors 12-16. While only five such connectors are specifically shown in the embodiment of FIG. 1, it will be appreciated that more or less than this number of connectors may be used to accomodate the need of a specific hybrid circuit.

Figure 2:
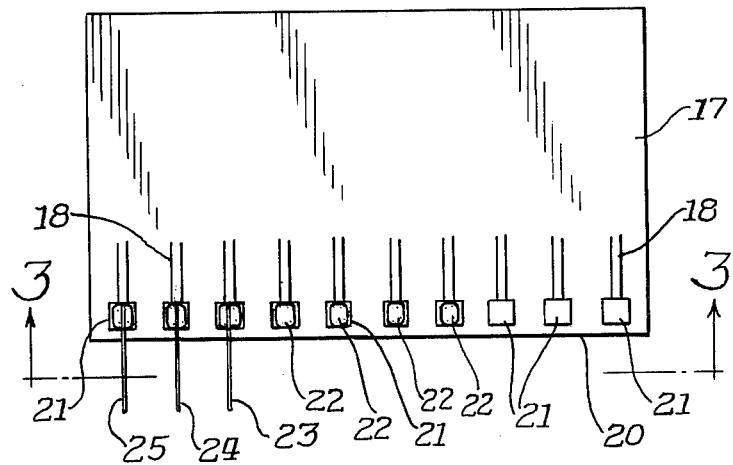
FIG. 2 is a top plan view of a thick film circuit illustrating various stages of the method of the present invention.
Figure 3:
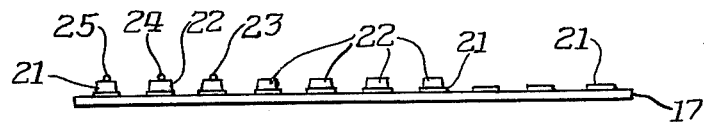
FIG. 3 is a front elevational view taken along the line 3—3 of FIG. 2.

Thick film circuit 11 conventionally comprises a substrate 17 having a geometry of conductors 18 and resistors 19 deposited thereon. As best seen in FIG. 2, conductors 18 terminate along a free edge 20 of substrate 17 in a plurality of generally rectangular conductive terminal pads 21. Terminal pads 21, which provide for convenient access to the circuitry of thick film circuit 11, normally mate with a connector assembly for interfacing thick film circuit 11 with its operating environment. In this regard, thick film circuit 11 may typically, by means of its associated connector assembly, be plugged into a printed circuit board or the like. Moreover, as previously explained, in order to insure the existence of a sufficiently strong connection between the individual leads of the connector assembly and their associated terminal pads, it has been standard prior art practice to include some sort of mechanical strengthening aid such as a clip intended to engage substrate 17 while making electrical contact with one of the terminal pads.

Substrate 17, which serves as a foundation upon which the thick film circuitry is formed, normally comprises a ceramic material such as alumina or beryllia. The processing of the ceramic material comprising substrate 17 is accomplished at temperatures in the area of 1400°-1900° C thereby eliminating the possibility of excessive chemical interaction between the substrate and the deposited conductive and resistive pastes which are fired at levels ranging from about 700° to 1000° C. The conductive paste is normally deposited on substrate 17 by means of screen-process printing techniques and may comprise, for example, silver, silver-palladium or silver-platinum plus glass frit compositions. The resistive paste, which is also deposited on substrate 17 and, to some extent, overlying conductive pattern 18, by screen-process printing techniques generally comprises a composition such as ruthenium oxide plus glass frit. Terminal pads 21 may be formed on substrate 17 at the same time and comprise the same material as conductors 18. However, in accordance with the present invention it is considered preferable to employ a separate terminal pad deposition step wherein a high adhesion strength conductive material is used to form terminal pads 21. Materials such as those manufactured by Engelhard Minerals and Chemicals Corporation under the designation A3058 and A3147, those manufactured by Cermalloy Cermet Division of Bala Electronics Corporation under the designation 4402 and 4510, and those manufactured by E. I. Du Pont de Nemours and Company under the designation 9770 are suitable for this purpose. These materials are capable of tenaciously bonding to substrate 17 thereby minimizing the possibility of one of the terminal pads peeling from the substrate in response to a suitably applied force.

FIGS. 2-5 illustrate an embodiment of the method of the present invention wherein a plurality of rigid connectors, such as connectors 12-16 shown in FIG. 1, are attached to the terminal pads deposited on a thick film substrate. In FIG. 2, terminal pads 21 occupying the right three positions disposed along edge 20 of substrate 17 are representative of the unprocessed terminal pads formed as described above. A solder paste fillet 22 is initially deposited on each of the unprocessed terminal pads as seen in the central four terminal pad positions in FIGS. 2 and 3. Preferably, metal mask printing techniques are used to form solder paste fillets 22 so that a solder paste having a consistency compatible with metal mask printing is employed. The solder paste used to form fillets 22 should further be characterized by a high degree of strength and also have a relatively high melting point. Solder paste comprising a composition of silver and tin ranging in amounts from approximately 95% to 96.5% tin and 5% to 3.5% silver fulfills these requirements and has been found to perform adequately when used as described herein. Although the foregoing composition is preferred, a high-strength solder having a lower melting point, such as a composition comprising 60% tin and 40% lead, can also be used. However, care must be exercised to avoid weakening the connection between the rigid connectors and terminal pads 21 when joining the connectors to other circuitry by soldering operations. In this regard, steps should be taken to insure that the solder fillets formed on terminal pads 21 do not reach a temperature of about 183° C. Such can be accomplished by using a low thermal conductivity connector, such as steel wire, a large hybrid circuit substrate which acts as a heat sink or by providing means for cooling the substrate. Next, the conductive connectors are disposed horizontally over substrate 17 with one end thereof resting on solder paste fillets 22 as shown by connectors 23, 24 and 25 in FIGS. 2 and 3. In this regard, the connectors themselves preferably comprise high stiffness wire which resists bending during transport or insertion into a printed circuit board. Steel or copper coated steel wire satisfy this criterion.

After the connectors have been so positioned, heat is applied to substrate 17 in order to reflow solder paste fillets 22. A temperature of about 250° C is typically required and the temperature cycle should be sufficiently gradual so as not to harm the thick film circuit or substrate. For example, a heating-cooling cycle of about 60 seconds wherein the solder is molten for approximately 5-15 seconds would be appropriate. With reference to FIGS. 4 and 5, it will be seen that after this reflowing step each solder paste fillet 22 will have been transformed into a hardened solder fillet 26 entirely enveloping its underlying terminal pad 21 as well as its associated one of connectors 23, 24, and 25. Furthermore, due to the greater weight of the connectors relative to the molten solder displaced thereby, the connectors will have gravitated to the bottoms of fillets 26 forming a connection with underlying terminal pads 21. Also, due to the strong surface tension exhibited by the molten solder and which acts upon terminal pads 21, the connectors will tend to centrally align with respect to their associated hardened solder fillets 26 (see in particular FIG. 5). That is, each hardened solder fillet 26 will have a connector extending therefrom over edge 20 from a point substantially central of its dimension in the direction of edge 20.

It has been found that the amount of solder paste used to form fillets 26 must be rather precisely controlled in order to achieve a connection between the connectors and their associated terminal pads of sufficient strength so that the use of ancillary mechanical supporting means may be circumvented. Essentially, solder paste fillets 22 comprise sufficient solder paste to form hardened fillets 26 which substantially envelop their underlying terminal pads 21 as well as their associated connectors. Thus, of course, hybrid circuits having variously sized terminal pads or using diversely configured connectors will require the deposition of different amounts of solder paste for forming fillets 22. However, the particular amount of solder paste used in any specific application will, nevertheless, be in accordance with the latter mentioned criterion. As a result of so forming hardened fillets 26, any forces acting upon one of the rigid connectors will uniformly transmit the resulting stress across the entire terminal pad thereby maximizing the threshold force needed to peel the pad from substrate 17 or to peel fillet 26 from its terminal pad. In addition, by enveloping the connectors on pads 21 with solder, the tendency of the connectors to shear from the formed and hardened solder fillets 26 upon the application of a force is greatly reduced.

A specific example of connections of the type illustrated in FIGS. 4 and 5 which have been found to perform quite adequately will now be presented. In this example, substrate 17 comprises a 96% alumina ceramic material having a thickness of approximately 0.030 inches and connectors 24 and 25 comprise 60% tin - 40% lead solder coated steel wire having a circular cross-section. The solder coating or conductors 24 and 25 facilitates solder reflow during assembly. Terminal pads 21 comprise 2500 psi adhesion strength generally rectangular shaped conductors having a dimension along edge 20 of about 0.070 inches and a transverse dimension of approximately 0.08 inches. Therefore, terminal pads 21 exhibit an overall bond to substrate 17 of about 14 pounds. Hardened solder fillets 26 are formed by reflowing 0.009 gram cubular solder paste fillets, such as those shown at 22 in FIGS. 2 and 3. The deposited solder paste fillets overlay substantially the entire surface of the terminal pads and have a height above substrate 17 of about 0.03 inches. In this example, the connections formed by hardened fillets 26 exhibit 90° peel strengths (i.e., a vertical force applied upwardly on conductors 24 and 25 until a failure in the connection occurs) averaging about 8 pounds with a minimum strength of 6 pounds being easily maintainable. Larger weights of solder, up to 0.016–0.024 grams, provide higher strengths up to about 14 pounds, the overall bond of terminal pads 21 to substrate 17. Connection strengths ranging between 6 to 8 pounds are considered sufficient to enable the secured connectors, when plugged into a printed circuit board or the like, to self-support substrate 17 without the inclusion of ancillary mechanical supporting apparatus.

In order to facilitate the reflowing process it has been found beneficial to incorporate in the solder paste a mildly activated rosin flux prior to the deposition of solder paste fillets 22. The mildly activated rosin flux aids wetting of the terminal pads, of the solder particles in the solder paste, and of the associated connectors during solder reflow and contributes to the formation of more structurally and electrically sound connections. A pure rosin flux is too mild for this purpose and a fully activated flux causes excess leaching of terminal pads 21.

In FIG. 6, a method for simultaneously forming two connector assemblies in accordance with the process of the present invention is shown. In accordance with this method, a pair of thick film circuits 31 and 41 are located in a common horizontal plane 42 with their terminal pad bearing edges 33 and 43 opposingly disposed in parallel spaced relationship. The relative longitudinal displacement of the two thick film circuits is adjusted so that the terminal pads 34 of thick film circuit 31 are in transverse alignment with the terminal pads 44 of thick film circuit 41. Appropriate solder paste fillets are then deposited on the terminal pads 34 and 44 as previously described. A plurality of elongated wire connectors 50 are next bridged across respective pairs of transversely aligned terminal pads 34, 44. These connectors are approximately twice the length of the single connectors previously described. Heat is then simultaneously applied to the substrates of both thick film circuits 31 and 41 to reflow the deposited solder paste fillets and thereby achieve a self-supporting solder connection between each connector 50 and its associated terminal pads 34 and 44 on circuits 31 and 41. Finally, conductors 50 are cut at a point intermediate their distal ends whereby two thick film circuit-connector assembly structures similar to that shown in FIG. 1 are formed simultaneously.

The process described above with reference to FIG. 6 offers several advantages over the individually constructed thick film circuit-connector assembly structures. Initially, in the individually constructed assemblies, means must generally be included for supporting and positioning the unattached ends of the connectors prior to and during the solder reflow step. While various alternatives are available to accomplish such, they will all generally degrade the solder coating on the connector due to the physical contact between the connector and the supporting device. This problem is avoided in the FIG. 6 embodiment since both ends of the connector are supported on a solder paste fillet and form connections to both thick film circuits simultaneously. Furthermore, due to the self-aligning action previously discussed, by originally positioning terminal pads 34 and 44 in relatively precise transverse alignment, it is insured that connectors 50 will extend orthogonally of edges 33 and 43 even though they may have been originally placed on the solder paste fillets in a somewhat skewed orientation (see, for example, the lower most connector in FIG. 6). It will be recalled that during reflow the connectors tend to gravitate toward a central position at the bottom of the solder fillets. Thusly, if terminal pads 34 and 44 are originally aligned, whereby the deposited solder paste fillets will also be aligned, it will be seen that connectors 50 will self-align in substantially parallel spaced relationship and orthogonally of edges 33 and 43. Since connectors 50 must ultimately mate with a suitably preconfigured series of apertures on a printed circuit board or the like, it is of some importance that the spatial orientation of the connectors be relatively precisely controlled. The foregoing self-alignment characteristic of the FIG. 6 embodiment serves this purpose.

As previously mentioned, the connectors, in addition to providing an electrical interface to the thick film circuit, self-support substrate 17 when the circuit is used in association with, for example, a printed circuit board. To facilitate such, the connectors shown in FIGS. 4 and 5 may be modified as shown in FIG. 7. Here, the attached connectors are alternately bowed in opposing directions as shown at 61 and 62. The bowed portions of the connectors provide a bearing surface 63 which abuts the surface of a printed circuit board 64 and provide means for controlling the distance between the surface of board 64 and substrate 17 of the thick film circuit.

Typically, the connectors will be both mechanically and electrically secured to circuit board 64 by solder applied, for example, by wave solder techniques. Solder commonly used for this purpose has a melting temperature of about 186° C and reflows at about 220°-230° C. However, since the melting point of the preferred solder composition used to form fillets 26 is about 221° C and since substrate 17 acts as a heat sink, the temperature of fillets 26 will remain below 221° C and no adverse effect will result in the connection of the connectors to terminal pads 21.

It is thus seen that the present invention discloses a method for securely attaching a plurality of rigid connectors to the circuitry of a thick film circuit. Additionally, the connections are of sufficient strength to enable the rigid connectors to self-support the thick film circuit on a printed circuit board without any additional mechanical supporting aids.

Obviously, many modifications and variations of the present invention are possible in the light of the above teachings. It is, therefore, to be understood that within the scope of the appended claims, the invention may be practice otherwise than as specifically described.

I claim:

1. A method of attaching a plurality of relatively rigid conductive connectors to a plurality of terminal pads spaced along an edge of the substrate of a first hybrid circuit for forming a connector assembly capable of self-supporting said first hybrid circuit when received by suitably configured utilization means comprising the steps of:
   depositing a predetermined amount of solder paste on each of said terminal pads thereby forming a solder paste fillet overlying each of said terminal pads;
   locating one end of each of said connectors on a respective one of said solder paste fillets; and
   gradually heating said substrate for reflowing said solder paste fillets to achieve a high strength non-mechanically supported solder connection between said one end of each of said rigid connectors and its associated terminal pad;
   said predetermined amount comprising an amount of solder paste such that said solder connections substantially envelope said one end of each of said rigid connectors and its associated terminal pad.

2. The method according to claim 1 wherein the weight of said rigid connectors and solder paste are selected such that upon reflowing each of said rigid connectors settles in a position closely adjacent its associated terminal pad.

3. The method according to claim 2 including the step of coating each of said connectors and its associated terminal pad with solder by incorporating a mildly activated rosin flux in said solder paste.

4. The method according to claim 1 wherein said solder paste has a melting temperature of at least substantially 221° C.

5. The method according to claim 1 wherein said solder paste comprises a composition of silver and tin ranging in amounts from about 95% to 96.5% tin and 5% to 3.5% silver.

6. The method according to claim 5 wherein each of said terminal pads are generally rectangularly shaped having dimensions of approximately 0.070 inches by 0.080 inches and comprises a conductor having an adhesion strength to said substrate of about 2500 psi, said predetermined amount of solder paste comprising substantially 0.009 grams and said connector having a diameter of approximately 0.020 inches.

7. The method according to claim 1 including the steps of:
   providing a second hybrid circuit having a substrate including a plurality of terminal pads spaced along an edge thereof;
   depositing said predetermined amount of solder paste on each of said second circuit terminal pads thereby forming a solder paste fillet overlying each of said second circuit terminal pads;
   locating the other end of each of said connectors on a respective one of said second circuit solder paste fillets;

gradually heating said first and second hybrid circuit substrates for reflowing said second solder paste fillets simultaneously with said first circuit solder paste fillets to achieve a high strength non-mechanically supported solder connection substantially enveloping said other end of each of said rigid connectors and its associated second circuit terminal pad; and cutting each of said connectors at a point intermediate of its two ends.

8. The method according to claim 7 wherein said locating step comprises the steps of:

orienting the substrates of said first and second hybrid circuits in a common plane wherein said terminal pad bearing edges are opposingly disposed in substantially parallel spaced relationship with each of said first circuit terminal pads being in transverse alignment with one of said second circuit terminal pads; and bridging transversely aligned pairs of said first and second circuit solder paste fillets with said rigid connectors such that, upon performance of said reflowing step, each of said ends of each of said connectors settles in a position closely adjacent its associated terminal pad and centrally thereof for causing said connectors to self-align transversely of said edges.

9. The method according to claim 8 wherein said solder paste comprises a composition of silver and tin ranging in amounts from about 95% to 96.5% tin and 5% to 3.5% silver.

* * * * *